United States Patent [19]

Urata et al.

[11] Patent Number: 4,533,623

[45] Date of Patent: Aug. 6, 1985

[54] SILVER HALIDE PHOTOGRAPHIC LIGHT-SENSITIVE MATERIALS FOR PLATE MAKING AND METHOD OF REDUCTION TREATMENT FOR THEM

[75] Inventors: Yukihide Urata; Shigenori Moriuchi; Taku Nakamura; Masashi Ogawa, all of Kanagawa, Japan

[73] Assignee: Fuji Photo Film Co., Ltd., Kanagawa, Japan

[21] Appl. No.: 648,105

[22] Filed: Sep. 7, 1984

Related U.S. Application Data

[62] Division of Ser. No. 415,297, Sep. 7, 1982, abandoned.

[30] Foreign Application Priority Data

Sep. 7, 1981 [JP] Japan ................................ 56-140669

[51] Int. Cl.³ ........................... G03F 7/02; G03F 7/00; G03C 1/76; G03C 1/30
[52] U.S. Cl. ..................................... 430/309; 430/302; 430/306; 430/539; 430/621; 430/623; 430/626; 430/642
[58] Field of Search ............... 430/302, 309, 306, 961, 430/539, 621–626, 627–630, 642

[56] References Cited

U.S. PATENT DOCUMENTS 4,297,436 10/1981 Kubotera et al. .................... 430/302
4,455,365 6/1984 Urata et al. .......................... 430/539

Primary Examiner—Mary F. Downey
Attorney, Agent, or Firm—Sughrue, Mion, Zinn, Macpeak and Seas

[57] ABSTRACT

A silver halide photographic light-sensitive material for plate making is disclosed. The material is comprised of a support base having thereon a sensitive silver halide emulsion layer and at least one upper insensitive layer having a melting time longer than the melting time of the sensitive silver halide emulsion layer. A method of reduction treatment for such silver halide light-sensitive material is also disclosed. The sensitive materials have excellent aptitude for reduction treatment and do not deteriorate even if the amount of silver per unit area is relatively small.

17 Claims, No Drawings

SILVER HALIDE PHOTOGRAPHIC LIGHT-SENSITIVE MATERIALS FOR PLATE MAKING AND METHOD OF REDUCTION TREATMENT FOR THEM

This is a division of application Ser. No. 415,297, filed Sept. 7, 1982, now abandoned.

FIELD OF THE INVENTION

The present invention relates to silver halide photographic light-sensitive materials for plate making (hereinafter referred to as "plate making sensitive material") and a method of reduction treatment for them.

BACKGROUND OF THE INVENTION

Plate making sensitive materials are light-sensitive materials used in a photographic plate making step in the printing industry (as described in U.S. Pat. Nos. 3,600,174, 4,126,472, 3,847,518, etc.), such as for converting a light-shade image into a halftone image or photographing a line drawing, etc.

Generally, with respect to these plate making sensitive materials, silver images obtained by development processing are halftone images or line drawing images. When they are used for making printing plates, a treatment called reduction treatment is frequently carried. This treatment is performed in order to obtain delicate reproduction of tone or satisfy artistic expression of the images adapting to printing characteristics, by which fine correction of images is carried out partially or completely. The corrections may include reduction of the area of dots or widening or narrowing of the width of line drawing.

Therefore, aptitude for reduction treatment is a very important property in plate making sensitive materials.

When carrying out reduction treatment of plate making sensitive materials having halftone images or line drawing images formed by exposure and development, it has been known to use a method which comprises contacting metal silver forming the halftone images or line drawing images with a reducer.

For example, reducers using a reducing component such as permanganate, ferric salt, cerium (IV) salt, red prussiate, bichromate or persulfate, etc., have been described in Mees, *The Theory of the Photographic Process*, pages 738–739 (1954, published by Macmillan Co.).

Since the reduction treatment means the treatment comprising oxidizing silver images by a reducer to dissolve them, then image density is necessarily lowered by this treatment.

Therefore, a measure of the extent to which halftone image can be corrected can be represented by a reduction of the area of dots while maintaining the black density of each dot at a specified value or more.

In the present specification, the term "reduction width" means a reduction of the area of dots from the area of dots before the reduction treatment when the black density of the dots is reduced by the reduction treatment to the lowest value necessary for the photographic plate making step. Thus, the wider the reduction width is, the higher the reduction treatment aptitude is.

A method for improving reduction ability is described in Japanese Patent Application (OPI) No. 68419/77 (the term "OPI" as used herein refers to a "published unexamined Japanese patent application") wherein mercapto compounds, such as monothioglycerol, α-amino-ethanthiol, etc., are used for the reduction treatment. However, the reducer is specific and difficult to use, because its reduction rate is different from that of conventionally used reducers. Further, it is possible to widen the reduction width while increasing the covering power by softening the emulsion membrane, but the required film strength cannot be obtained by this method.

Another method for widening the reduction width is increasing the silver content. This method is effective because the ability to correct images by the reduction treatment is increased when there is a greater amount of silver in the silver images per unit area. However, since silver is very expensive and rare, increasing the amount of silver is not preferred with respect to the cost of the plate making sensitive materials and economy of resources.

Accordingly, it is an important subject in this field to produce plate making sensitive materials having the required properties while using silver in an amount as low as possible.

SUMMARY OF THE INVENTION

A primary object of the present invention is to provide plate making sensitive materials having excellent aptitude for reduction treatment.

Another object of the present invention is to provide plate making sensitive materials in which the aptitude for reduction treatment does not deteriorate even if the amount of silver per unit area is reduced.

Yet another object of the present invention is to provide a method of reduction treatment having a wide reduction width when using plate making sensitive material having a small amount of silver per unit area.

The present inventors have found that excellent reduction characteristics can be obtained with a small amount of silver by providing a silver halide photographic sensitive material for plate making comprising a support base having thereon a sensitive silver halide emulsion layer and at least one insensitive upper layer having a melting time (described in the following) longer than the melting time of the sensitive silver halide emulsion layer.

DETAILED DESCRIPTION OF THE INVENTION

In the present invention, at least one insensitive upper layer having a melting time longer than the melting time of the sensitive silver halide emulsion layer means that said insensitive upper layer is strongly hardened than the sensitive silver halide emulsion layer.

As means for evaluating the degree of hardening in the hardened layers, it is well known in this field to use degree of swelling when swelling the hardened layer with a certain solution or scratch strength represented by a weight which causes a scratch when the hardened layer is scratched with a weighted needle stylus. However, in order to evaluate the present invention, it is most effective to use the time required for a hardened film to melt when it is dipped in a solution kept at a certain specified temperature (melting time: MT). It is most preferred that the measurement of melting time is carried out in a 0.2N NaOH solution kept at 75° C., but the measurement is not always limited thereto.

In order to make the melting time of at least one insensitive upper layer longer than the melting time of the sensitive silver halide emulsion layer, it is sufficient to selectively make the degree of hardening of said insensitive upper layer higher than that of the sensitive silver halide emulsion layer. In such a case, the melting time of at least one insensitive upper layer according to the above measurement is preferably 50 seconds or more, more preferably 100 seconds or more, longer than the melting time of the sensitive silver halide emulsion layer.

In the present invention, in order to selectively harden at least one insensitive upper layer, it is possible to use a process which comprises reacting gelatin used as a main binder in the insensitive upper layer with a diffusible low molecular hardener to the extent of not damaging the coating property before application thereof and thereafter coating them. For example, a low molecular hardener having vinyl groups may be added to only a coating solution for forming a surface protective layer. After carrying out multilayer simultaneous application of coating solutions, coating layers are rapidly dried, by which the degree of hardening in each layer can be controlled, respectively. Further, it is possible to use a polymer having functional groups capable of causing a cross-linking reaction with gelatin through a hardener as described in U.S. Pat. No. 4,207,109.

Moreover, polymer having functional groups capable of reacting with gelatin (hereinafter referred to as "polymeric hardener") is anti-diffusible due to its high molecule. Thus, the polymeric hardener is preferably utilized to attain the objects of the present invention. Examples of the polymeric hardeners are disclosed in U.S. Pat. Nos. 3,671,256, 3,057,723, 3,396,029 and 4,161,407, British Pat. Nos. 1,534,455 and 2,064,800, and Japanese Patent Application (OPI) No. 142524/81 (corresponding to U.S. application Ser. No. 251,827, filed on Apr. 7, 1981), D. M. Burness, J. Pouradier, *The Theory of the Photographic Process*, 4th Ed., page 84 (T. H. James ed.), Macmillan, New York (1977), and G. A. Campbell, L. R. Hamilton and I. S. Ponticello, *Polymeric Amine and Ammonium Salts* (E. J. Geothals ed.), pp. 321–332, Pergamon Press, New York (1979), etc. Preferred polymeric hardener has a molecular weight of 10,000 or more.

One preferred example of the polymeric hardener is that described in Japanese Patent Application (OPI) No. 142524/81 (corresponding to U.S. application Ser. No. 251,827), which has a repeating unit represented by the following formula (I):

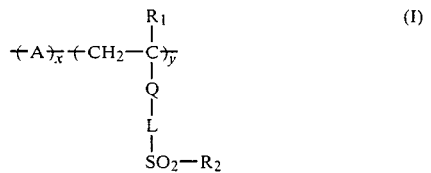  (I)

wherein A is a monomer unit prepared by copolymerizing copolymerizable ethylenically unsaturated monomers; $R_1$ is hydrogen or a lower alkyl group having 1 to 6 carbon atoms; Q is —$CO_2$—,

(wherein $R_1$ is the same as defined above) or an arylene group having 6 to 10 carbon atoms; L is a divalent group having 3 to 15 carbon atoms and containing at least one linking group selected from the members consisting of —$CO_2$— and

(wherein $R_1$ is the same as defined above) or a divalent group having 1 to 12 carbon atoms and containing at least one linking group selected from the members consisting of

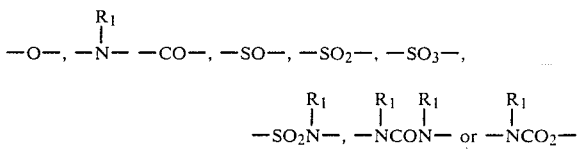

(wherein $R_1$ is the same as defined above); $R_2$ is —CH=$CH_2$ or —$CH_2CH_2X$ (wherein X is a group capable of being substituted with a nucleophilic group or a group capable of being released in the form of HX upon a base; and x and y each represents molar percent, x being between 0 and 99 and y being between 1 and 100.

Examples of ethylenically unsaturated monomers represented by "A" of formula (I) include ethylene, propylene, 1-butene, isobutene, styrene, chloromethylstyrene, hydroxymethylstyrene, sodium vinylbenzenesulfonate, sodium vinylbenzylsulfonate, N,N,N-trimethyl-N-vinylbenzylammonium chloride, N,N-dimethyl-N-benzyl-N-vinylbenzylammonium chloride, α-methylstyrene, vinyltoluene, 4-vinylpyridine, 2-vinylpyridine, benzyl vinylpyridinium chloride, N-vinylacetamide, N-vinylpyrrolidone, 1-vinyl-2-methylimidazole, monoethylenically unsaturated esters of aliphatic acids (e.g., vinyl acetate and allyl acetate), ethylenically unsaturated mono- or dicarboxylic acids and salts thereof (e.g., acrylic acid, methacrylic acid, itaconic acid, maleic acid, sodium acrylate, potassium acrylate and sodium methacrylate), maleic anhydride, esters of ethylenically unsaturated monocarboxylic or dicarboxylic acids (e.g., n-butyl acrylate, n-hexyl acrylate, hydroxyethyl acrylate, cyanoethyl acrylate, N,N-diethylaminoethyl acrylate, methyl methacrylate, n-butyl methacrylate, benzyl methacrylate, hydroxyethyl methacrylate, chloroethyl methacrylate, methoxyethyl methacrylate, N,N-diethylaminoethyl methacrylate, N,N,N-triethyl-N-methacryloyloxyethylammonium-p-toluene sulfonate, N,N-diethyl-N-methyl-N-methacryloyloxyethylammonium-p-toluene sulfonate, dimethyl itaconate and monobenzyl maleate), and amides of ethylenically unsaturated monocarboxylic or dicarboxylic acids (e.g., acrylamide, N,N-dimethylacrylamide, N-methylolacrylamide, N-(N,N-dimethylaminopropyl)acrylamide, N,N,N-trimethyl-N-(N-acryloylpropyl)ammonium-p-toluene sulfonate, sodium 2-acrylamide-2-methylpropane sulfonate, acryloyl morpholine, methacrylamide, N,N-dimethyl-N'-acryloyl propane diamine propionate betaine, and N,N-dimethyl-N'-methacryloyl propane diamine acetate betaine). "A" further includes monomers having at least two copolymerizable ethylenically unsaturated groups (e.g., divinylbenzene, methylenebisacrylamide, ethylene glycol diacrylate, trimethylene glycol diacrylate, ethylene glycol dimethacrylate, trimethylene glycol dimethacrylate and neopentyl glycol dimethacrylate).

Examples of $R_1$ of formula (I) include a methyl group, an ethyl group, a butyl group and an n-hexyl group.

Examples of Q of formula (I) include the following groups:

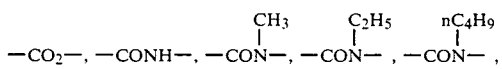

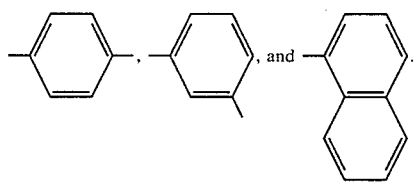

Examples of L of formula (I) include the following groups:

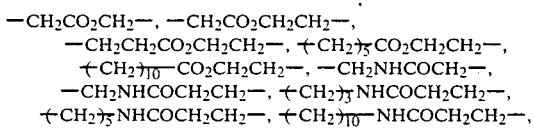

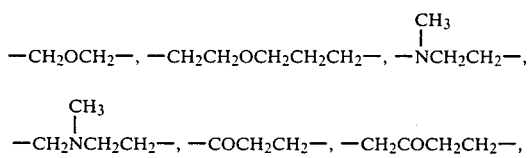

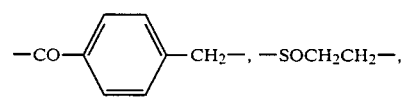

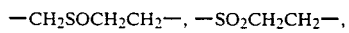

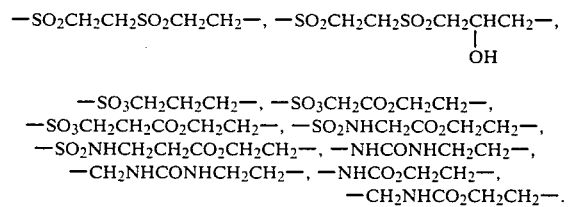

Examples of $R_2$ of formula (I) include the following groups:

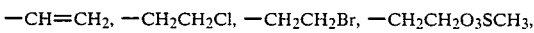

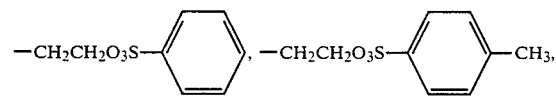

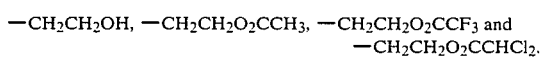

Another preferred example of the polymeric hardener is that described in U.S. Pat. No. 4,161,407, which has a repeating unit represented by the following formula (II):

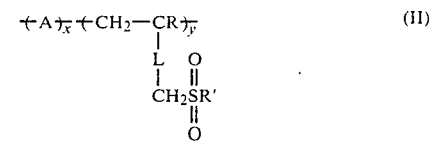

wherein A is a polymerized α,β-ethylenically unsaturated addition polymerizable monomer or a mixture of such polymerizable monomers; x and y are the molar percentages of the resulting units in the polymer and are whole integers, x being from 10 to about 95 percent and y being 5 to 90 percent; R is hydrogen or an alkyl group having 1 to 6 carbon atoms; R' is —CH=CHR$_2$ or —CH$_2$CH$_2$X where X is a leaving group which is displaced by a nucleophile or eliminated in the form of HX by treatment with base; R$_2$ is alkyl, aryl or hydrogen; —L— is a linking group selected from the group consisting of alkylene, preferably containing about 1 to 6 carbon atoms, such as methylene, ethylene, isobutylene and the like; arylene of about 6 to 12 nuclear carbon atoms, such as phenylene, tolylene, naphthalene and the like; —COZ— or —COZR$_3$—; R$_3$ is alkylene, preferably of 1 to 6 carbon atoms, or arylene, preferably of 6 to 12 carbon atoms; and Z is O or NH.

Examples of A of formula (II) include the same examples of A of formula (I), examples of R of formula (II) include the same examples of R$_1$ of formula (I) and examples of R' of formula (II) include the same examples of R$_2$ of formula (I), all of which are described above.

Still another preferred example of the polymeric hardener is that described in British Pat. No. 1,534,455, which has a repeating unit represented by the following formula (III):

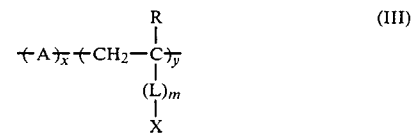

wherein A is a monomer unit copolymerized with a copolymerizable ethylenically unsaturated monomer; R is a hydrogen atom or an alkyl group having 1 to 6 carbon atoms; L is a divalent linking group having 1 to 20 carbon atoms; X is an active ester group; x and y each represents molar percent, with x being between 0 and 95 and y being between 5 and 100 and m is 0 or 1.

Examples of A of formula (III) include the same examples of A of formula (I) and examples of R of formula (III) include the same examples of R$_1$ of formula (I), both of which are described above.

Examples of L of formula (III) include the following:
—CONHCH$_2$—, —CONHCH$_2$CH$_2$—, —CONHCH$_2$CH$_2$CH$_2$—,
—CONHCH$_2$CH$_2$CH$_2$CH$_2$CH$_2$—, —CO$_2$CH$_2$CH$_2$OCOCH$_2$CH$_2$—, —CONHCH$_2$CONHCH$_2$—,
—CONHCH$_2$CONHCH$_2$CONHCH$_2$—, —CO$_2$CH$_2$—,
—CONHCH$_2$NHCOCH$_2$CH$_2$SCH$_2$CH$_2$—,
—CONHCH$_2$OCOCH$_2$CH$_2$—.

Examples of X of formula (III) include the following:

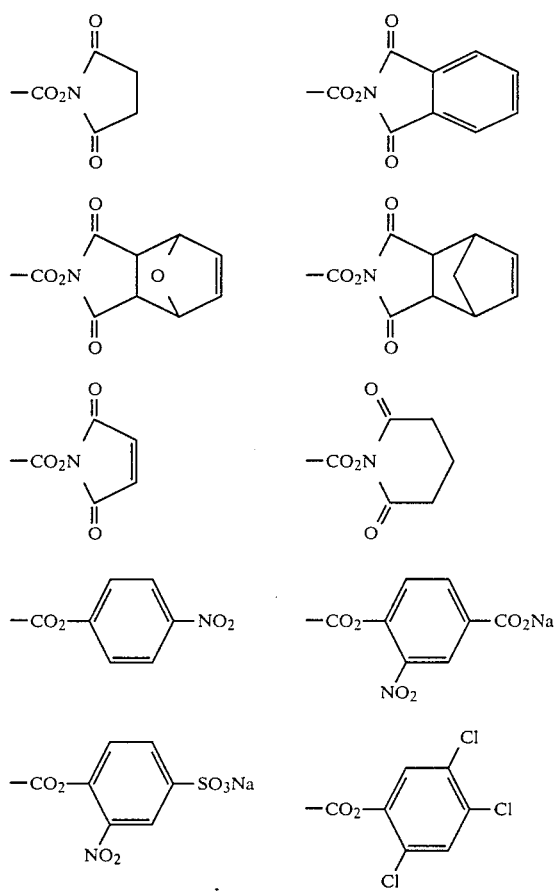
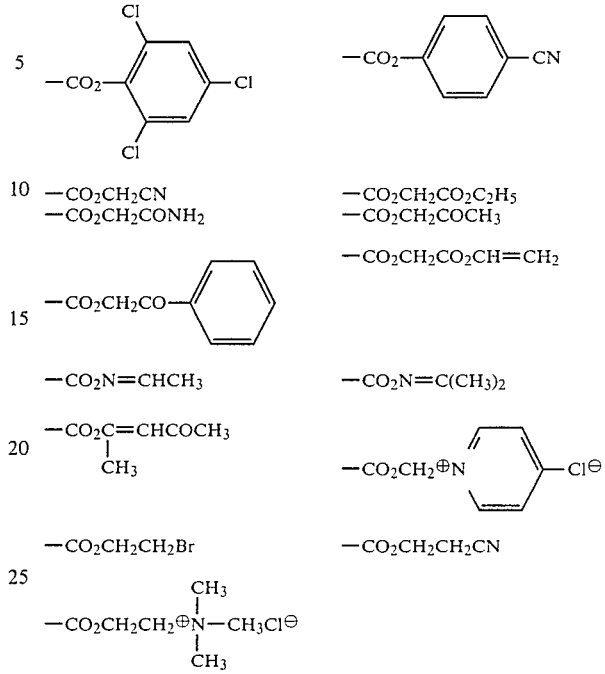
Among the above preferred examples of the polymeric hardeners, the polymeric hardener having repeating unit of formula (I) is particularly preferred.
Typical examples of the polymeric hardener are shown below as P-1 to P-17. Among them, P-1, 2, 16 and 17 are particularly preferred.
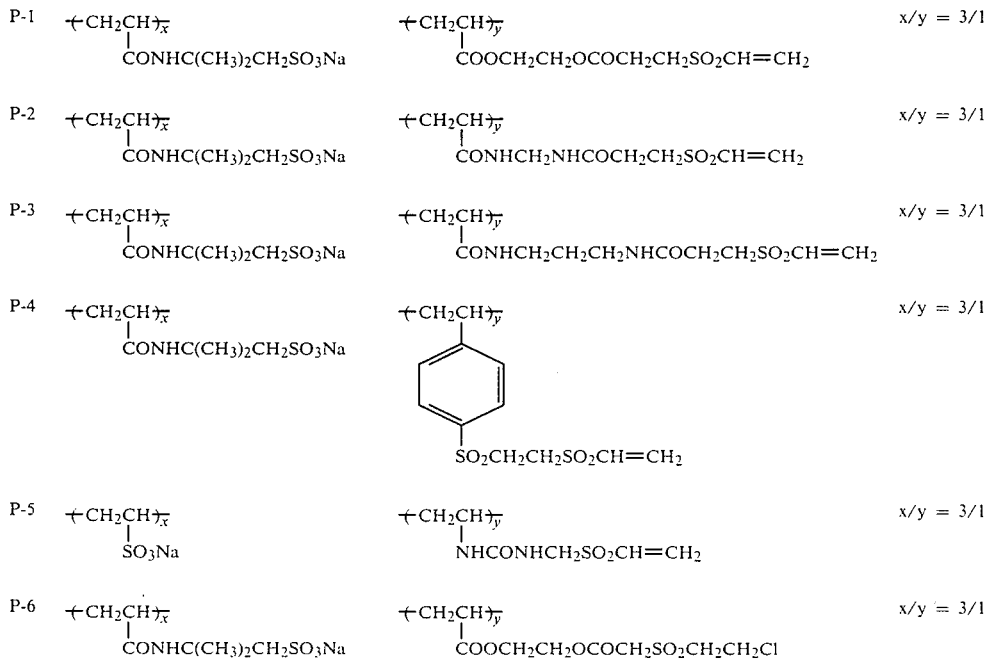

-continued

| | | | |
|---|---|---|---|
| P-7 | $-(CH_2CH)_{\overline{x}}-$ <br> [benzene with SO₃K] | $-(CH_2CH)_{\overline{y}}-$ <br> CONHCOCH₂CH₂SO₂CH₂CH₂Cl | x/y = 3/1 |
| P-8 | $-(CH_2CH)_{\overline{x}}-$ <br> COOM | $-(CH_2CH)_{\overline{y}}-$ <br> CONHCH₂COCH₂CH₂SO₂CH₂CH₂Cl | x/y = 10/1 |
| P-9 | $-(CH_2CH)_{\overline{x}}-$ <br> COOM | $-(CH_2CH)_{\overline{y}}-$ <br> CONHCH₂NHCOCH₂CH₂SO₂CH=CH₂ | x/y = 10/1 |
| P-10 | $-(CH_2CH)_{\overline{x}}-$ <br> COO(CH₂)₃SO₃Na | $-(CH_2CH)_{\overline{y}}-$ <br> CONH-[phenyl-OH] | x/y = 3/1 |
| P-11 | $-(CH_2CH)_{\overline{x}}-$ <br> CONH₂ | $-(CH_2CH)_{\overline{y}}-$ <br> [phenyl-NH-triazine(Cl,Cl)] | x/y = 20/1 |
| P-12 | $-(CH_2CH)_{\overline{x}}-$ <br> CONHC(CH₃)₂CH₂—SO₃Na | $-(CH_2CH)_{\overline{y}}-$ <br> COOCH₂CH₂N(CH₃)-[triazine(Cl,Cl)] | x/y = 5/1 |
| P-13 | $-(CH_2CH)_{\overline{x}}-$ <br> [benzene with SO₃K] | $-(CH_2CH)_{\overline{y}}-$ <br> [benzene with NHCONHCOCH₂CH₂Cl] | x/y = 10/1 |
| P-14 | $-(CH_2CH)_{\overline{x}}-$ <br> COONa | $-(CH_2-C(CH_3))_{\overline{y}}-$ <br> COOCH₂CH₂NHCONHCOCH₂CH₂Cl | x/y = 5/1 |
| P-15 | $-(CH_2CH)_{\overline{x}}-$ <br> CONHC(CH₃)₂CH₂SO₃Na | $-(CH_2-C(CH_3))_{\overline{y}}-$ <br> CONH(CH₂)₃NHCONHCOCH₂CH₂Cl | x/y = 10/1 |
| P-16 | $-(CH_2CH)_{\overline{x}}-$ <br> CONHC(CH₃)₂CH₂SO₃Na | $-(CH_2CH)_{\overline{y}}-$ <br> [phenyl-CH₂NHCOCH₂CH₂SO₂CH₂CH₂Cl] | x/y = 3/1 |

P-17 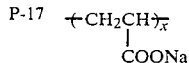 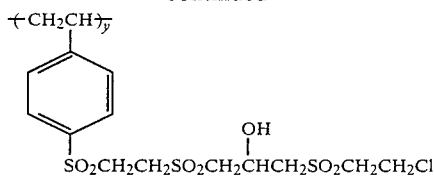 x/y = 3/1

M represents a hydrogen atom, a sodium atom or a potassium atom, and x and y each represents a molar percentage of each unit, which are not limited to the above described values, and x may have a value of 0 to 99 and y may have a value of 1 to 100.

In the following, examples of processes for synthesizing typical ethylenically unsaturated monomers having a vinyl sulfone group or a functional group as a precursor thereof, which are used for synthesizing polymeric hardeners used in the present invention are described.

PREPARATION EXAMPLE 1

Synthesis of 2-[3-(Chloroethylsulfonyl)propionyloxy]-ethylacrylate

A mixture of 600 ml of tetrahydrofuran, 45.8 g of hydroxyethyl acrylate, and 72 g of 3-(2-chloroethylsulfonyl)propionic acid chloride was placed in a reactor, and while maintaining the temperature at 5° C. or lower by cooling by ice water, a solution of 31.2 g of pyridine in 100 ml of tetrahydrofuran was added dropwise thereto over a period of 1.75 hours. The resulting mixture was further stirred for 2 hours at room temperature. At the end of the time, the reaction mixture was poured into 2,500 ml of ice water, and extraction was performed four times with 300 ml of chloroform. The organic layer thus extracted was dried over sodium sulfate and concentrated to provide 87 g of 2-[3-(chloroethylsulfonyl)propionyloxy]-ethylacrylate. Yield was 88%.

PREPARATION EXAMPLE 2

Synthesis of [3-(Chloroethylsulfonyl)propionyl]aminomethylstyrene

A mixture of 100 ml of tetrahydrofuran, 20.1 g of vinylbenzylamine, 16.7 g of triethylamine, and 0.1 g of hydroquinone was placed in a reactor, and while cooling with ice water, a solution of 36.1 g of β-chloroethylsulfonylpropionic acid chloride in 200 ml of tetrahydrofuran was added dropwise thereto over a period of 30 minutes. The resulting mixture was allowed to stand overnight at room temperature. The reaction mixture was then poured into a solution prepared by diluting 16.5 g of concentrated hydrochloric acid with 1,500 ml of ice water, and a precipitate was filtered off. The precipitate was recrystallized from a mixed solvent of 200 ml of ethanol and 200 ml of water to provide 26.8 g of N-vinylbenzyl-β-chloroethylsulfonyl propionic acid amide. Yield was 57%. Elemental analysis (found): H, 5.74; C, 53.47; N, 4.83; Cl, 10.99; S, 10.49.

PREPARATION EXAMPLE 3

Synthesis of 1-{[2-(4-Vinylbenzenesulfonyl)ethyl]sulfonyl}-3-chloroethylsulfonyl-2-propanol A mixture of 157 g of 1,3-bischloroethylsulfonyl-2-propanol (prepared by the method disclosed in British Pat. No. 1,534,455), 1,000 ml of methanol, and 1,000 ml of distilled water was placed in a reactor, and while maintaining the temperature at 46° C., a solution prepared by dissolving 52 g of potassium vinylbenzenesulfinate in 100 ml of methanol and 100 ml of distilled water was added dropwise thereto over a period of 1 hour. The resulting mixture was further stirred for 5.5 hours while maintaining at 46° C. The precipitate thus formed was filtered off to obtain 55 g of 2-(1-vinylbenzenesulfonyl)ethylsulfonyl-3-chloroethylsulfonyl-2-propanol. Yield was 49%. Elemental analysis (found): H, 4.67; C, 39.89; S, 21.43.

PREPARATION EXAMPLE 4

Synthesis of N-{[3-(Vinylsulfonyl)propionyl]aminomethyl}-acrylamide

In a 2,000 ml reactor were introduced 1,400 ml of distilled water, 224 g of sodium sulfite, and 220 g of sodium hydrogencarbonate, which were then stirred to form a uniform solution. Then, while maintaining the temperature at about 5° C. by cooling with ice water, 260 g of chloroethanesulfonyl chloride was added dropwise thereto over a period of 1.5 hours. After the dropwise addition was completed, 160 g of 49% sulfuric acid was added dropwise thereto over a period of about 15 minutes, and the resulting mixture was stirred for 1 hour at 5° C. Crystals precipitated were collected by filtration and washed with 400 ml of distilled water. The filtrate and the washing liquid were combined together and placed in a 3,000 ml reactor. Into the reactor was introduced dropwise a solution of 246 g of methylenebisacrylamide in 480 ml of distilled water and 1,480 ml of ethanol while maintaining the temperature at about 5° C. over a period of 30 minutes. The reactor was then placed in a refrigerator and was allowed to stand for 5 days to complete the reaction. Crystals precipitated were collected by filtration and, thereafter, they were washed with 800 ml of distilled water and recrystallized from 2,000 l of a 50% aqueous solution of ethanol to obtain 219 g of the desired monomer. Yield was 49%.

In addition, methods of synthesizing polymeric hardeners which are preferably used in the present invention will hereinafter be described.

PREPARATION EXAMPLE 5

Synthesis of 2-[3-(Vinylsulfonyl)propionyloxy]ethyl Acrylate/Sodium Acrylamido-2-methylpropanesulfonate Copolymer (P-1)

A mixture of 60 ml of N,N-dimethylformamide, 14.5 g of 2-[3-(chloroethylsulfonyl)propioyloxy]ethyl acrylate, and 23.5 g of acrylamido-2-methylpropanesulfonic acid was placed in a reactor. After purging with nitrogen gas, the mixture was heated to 60° C., and 0.40 g of 2,2'-azobis(2,4-dimethylvaleronitrile) was added thereto. The resulting mixture was stirred for 2 hours while heating at that temperature. Subsequently, 0.2 g of 2,2'-azobis(2,4-dimethylvaleronitrile) was added, and the mixture was stirred for 2 hours while heating. At the end of the time, the mixture was cooled down to 5° C., and 12 g of sodium carbonate and 4.9 g of triethylamine were added. The resulting mixture was stirred for 1 hour and additionally for 1 hour at room temperature. The reaction mixture was placed in a tube of cellulose and was subjected to dialysis for 2 days. The product was freeze-dried to obtain 35 g of a white polymer. Yield was 95%. The vinylsulfone content of the polymer thus formed was $0.51 \times 10^{-3}$ equivalent/g.

PREPARATION EXAMPLE 6

Synthesis of [3-(Chloroethylsulfonyl)propionyl]aminomethylstyrene/Sodium Acrylamido-2-methylpropanesulfonate Copolymer (P-16)

A mixture of 15.8 g of [3-(vinylsulfonyl)propionyl]aminomethylstyrene, 23.6 g of sodium acrylamido-2-methylpropanesulfonate, and 75 ml of N,N-dimethylformamide was placed in a reactor. After purging with nitrogen gas, the mixture was heated to 80° C., and 0.75 g of 2,2'-azobis(2,4-dimethylvaleronitrile) was added thereto. The resulting mixture was stirred for 3 hours while heating. Then, 25 ml of N,N-dimethylformamide was added, and subsequently 6.1 g of triethylamine was added dropwise at room temperature. The resulting mixture was stirred for 1 hour at room temperature. At the end of the time, the reaction mixture was filtered. The filtrate thus obtained was poured into 800 ml of acetone, and the thus-formed precipitate was filtered off and dried to obtain 36.2 g of pale yellow polymer. Yield was 94%. The vinylsulfone content of the polymer was $0.80 \times 10^{-3}$ equivalent/g.

PREPARATION EXAMPLE 7

Synthesis of 1-{[2-(4-Vinylbenzenesulfonyl)ethyl]-sulfonyl}-3-chloroethylsulfonyl-2-propanol/Sodium Acrylate Copolymer (P-17)

A mixture of 300 ml of N,N-dimethylformamide, 40.1 g of 2-(1-vinylbenzenesulfonyl)ethylsulfonyl-3-chloroethylsulfonyl-2-propanol, and 13.0 g of acrylic acid was placed in a reactor. After purging with nitrogen gas, the mixture was heated to 70° C., and 0.53 g of 2,2'-azobis(2,4-dimethylvaleronitrile) was added thereto. The resulting mixture was heated for 1.5 hours while stirring. Subsequently, 0.53 g of 2,2'-azobis(2,4-dimethylvaleronitrile) was added thereto, and the mixture was further heated for 1 hour while stirring. The reaction mixture was allowed to cool down to room temperature, and 54.8 g of a 28% methanol solution of sodium methylate was added dropwise thereto. Stirring was further continued for 1 hour. The reaction mixture was placed in a tube of cellulose and was subjected to dialysis for 2 days. The product was freeze-dried to obtain 30 g of pale yellow polymer. Yield was 56%. The vinylsulfone content of the polymer was $1.4 \times 10^{-3}$ equivalent/g.

PREPARATION EXAMPLE 8

Synthesis of Polymer (P-2)

A mixture of 5.65 g of the monomer prepared in Preparation Example 1, 9.16 g of sodium acrylamido-2-methylpropanesulfonate, and 80 ml of a 50% aqueous solution of ethanol was placed in a 200 ml reactor, and was heated to 80° C. while stirring. At this temperature, 0.1 g of 2,2'-azobis(2,4-dimethylvaleronitrile) (sold by Wako Pure Chemical Industries Ltd. under the trade name of V-65) was added and additionally, after 30 minutes, 0.1 g of the same compound as above was added. The mixture was heated for 1 hour while stirring. Thereafter, the reaction mixture was cooled down to about 10° C. with ice water, and a solution of 2.5 g of triethylamine in 80 ml of ethanol was added thereto. Stirring was further continued for 1 hour. At the end of the time, the reaction mixture was poured into 1,000 ml of acetone while stirring, and the thus-formed precipitate was filtered off to obtain 12.4 g of Polymer (P-2). Yield was 85%. The intrinsic viscosity, [η], was 0.227, and the vinylsulfone content was $0.95 \times 10^{-3}$ equivalent/g.

The above polymeric hardener is anti-diffusible due to its high molecule. Thus, when the polymeric hardener is added to at least one insensitive upper layer, said insensitive upper layer only is selectively hardened.

In order to harden the sensitive silver halide emulsion layers, the above described polymeric hardeners may be used, but diffusible low molecular hardeners are preferably used. The diffusible low molecular hardener may be added to the insensitive upper layer or the sensitive silver halide emulsion layer. In the latter case, the diffusible low molecular hardener can diffuse into the inseisitive upper layer wherein the above polymeric hardener is added. Thus, the insensitive upper layer is hardened by both the polymeric hardener and the diffusible low molecular hardener. Thereby, the insensitive upper layer is strongly hardened than the sensitive silver halide emulsion layer. Examples of such diffusible hardeners include various kinds of organic and inorganic hardeners which can be used alone or in combination thereof. Typical examples of them include aldehyde compounds such as mucochloric acid, formaldehyde, trimethylolmelamine, glyoxal, 2,3-dihydroxy-1,4-dioxane, 2,3-dihydroxy-5-methyl-1,4-dioxane, succinaldehyde or glutaraldehyde, etc.; active vinyl compounds such as divinyl sulfone, methylenebismaleimide, 1,3,5-triacryloylhexahydro-s-triazine, 1,3,5-trivinylsulfonylhexahydro-s-triazine, bis(vinylsulfonylmethyl)ether, 1,3-bis(vinylsulfonyl)propanol-2, bis(α-vinylsulfonylacetamide)ethane, 1,2-bis(vinylsulfonyl)-ethane or 1,1'-bis(vinylsulfonyl)methane, etc.; active halogen compounds such as 2,4-dichloro-6-hydroxy-s-triazine, etc.; and ethyleneimine compounds such as 2,4,6-triethyleneimino-s-triazine, etc., which are well known hardeners for gelatin. Preferred diffusible low molecular hardener has a molecular weight of 1,000 or less.

Among the above described diffusible low molecular hardeners, active vinyl compounds are particularly preferred. When the active vinyl compound is used as the diffusible low molecular hardener together with the above described polymeric hardener, not only the rate of hardening reaction can be increased, but also change of reduction aptitude due to change of reducer composition can be minimized.

Active vinyl compounds used in the present invention as the diffusible low molecular hardener include acryloyl hardeners and vinyl sulfone compounds. These low molecular hardeners preferably have a molecular weight of 1,000 or less.

Acryloyl hardeners used in the present invention include compounds having at least two acryloyl groups in the molecule thereof and compounds having one carbonyl group being connected to two vinyl groups (for example, example compound A-4 disclosed below). Representative examples of the acryloyl hardener are disclosed below.

CH₂=CH—CONH—CH₂CH₂—NHCOCH=CH₂  A-1

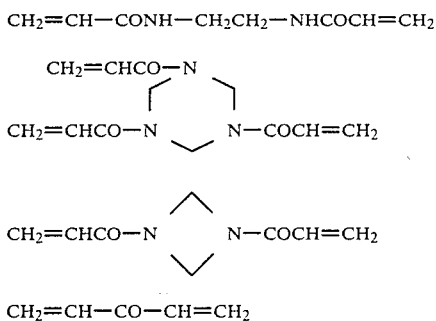
A-2

A-3

CH₂=CH—CO—CH=CH₂  A-4

The above acryloyl compounds can be synthesized according to the methods described, for example, in U.S. Pat. No. 3,640,720, British Pat. No. 994,869, West German Pat. No. 872,153 and Japanese Patent Publication Nos. 106/71 and 13141/72.

Vinyl sulfone low molecular hardeners are particularly preferably used in the present invention as the active vinyl diffusible low molecular hardener. Many vinyl sulfone low molecular hardeners are known in the field of photographic light-sensitive materials, for example, as disclosed in U.S. Pat. Nos. 3,490,911, 3,642,486, 3,811,891, 3,841,872, 3,850,637, 3,868,257, 4,088,495, 4,134,765, 4,134,770, 4,137,082, 4,137,440, 4,142,897 and 4,171,976. Any of the above vinyl sulfone low molecular hardeners can be used in the present invention. Furthermore, compounds having 1 sulfonyl group being connected to 2 vinyl groups (for example, example compound V-38 disclosed below) as well as vinylsulfonylalkyl compounds being connected with a carbon atom or a hetero atom, vinyl sulfone compounds being connected through an amido group or an ester group, and vinyl sulfone compounds being connected through a hetero ring (such as triazine ring, etc.) or an aromatic ring (such as phenylene group, etc.) are also used in the present invention.

Representative examples of the vinyl sulfone low molecular hardener are disclosed below.

V-1

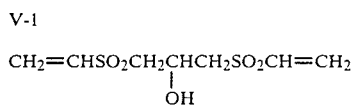

V-2

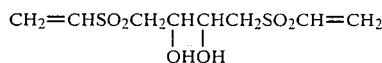

V-3

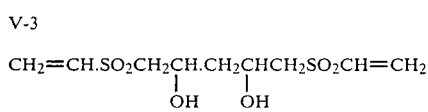

V-4

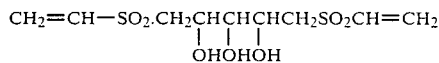

V-5

(CH₂=CH—SO₂CH₂CONH)₂

V-6

(CH₂=CH.SO₂CH₂CONH)₂CH₂

V-7

(CH₂=CHSO₂CH₂CONHCH₂)₂

V-8

(CH₂=CHSO₂CH₂CONHCH₂)₂CH₂

V-9

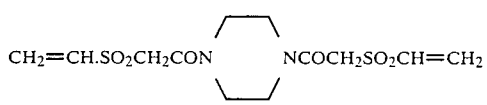

V-10

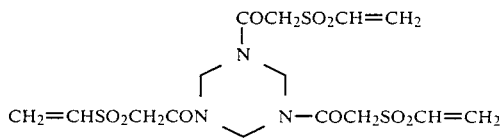

V-11

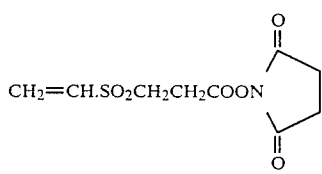

V-12

V-13

CH₂=CHSO₂CH₂SO₂CH=CH₂

V-14

CH₂=CH.SO₂CH₂CH₂SO₂CH=CH₂

V-15

CH₂=CH.SO₂CH₂CH₂CH₂SO₂CH=CH₂

V-16

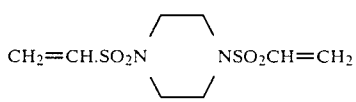

V-17

C₂H₅C(CH₂SO₂CH=CH₂)₃

V-18

CH₂=CHSO₂CH₂CHCH₂SO₂CH=CH₂
              |
              SO₂CH=CH₂

V-19

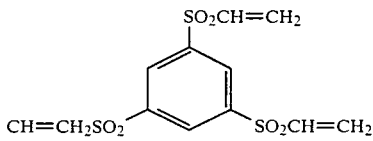

V-20

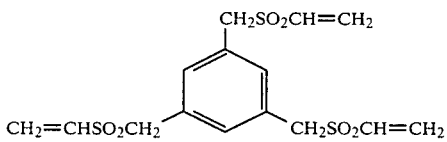

V-21

(CH₂=CHSO₂CH₂)₄C

V-22

(CH₂=CHSO₂CH₂)₃CCH₂SO₂CHCH₂NHCH₂CH₂SO₃Na

V-23

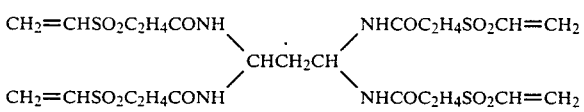

V-24

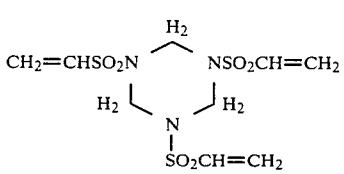

V-25

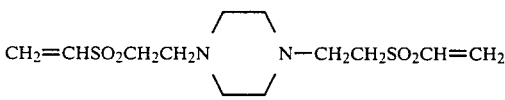

V-26

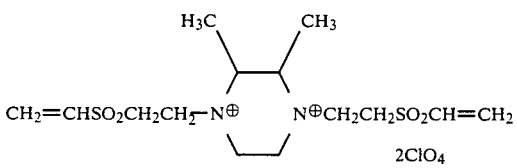
2ClO₄

V-27

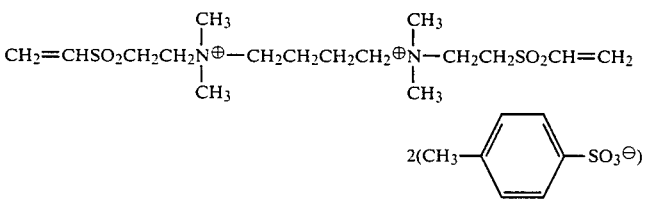
2(CH₃—⌬—SO₃⁻)

V-28

CH₂=CHSO₂CH₂CH₂SO₂CH₂CH₂SO₂CH=CH₂

V-29

CH₂=CHSO₂CH₂CH₂OCH₂CH₂NHCONHCH₂CH₂OCH₂CH₂SO₂CH=CH₂

V-30

CH₂=CHSO₂CH₂CH₂OCH₂CH₂OCH₂CH₂SO₂CH=CH₂

V-31

CH₂=CHSO₂CH₂OCH₂SO₂CH=CH₂

V-32

CH₂=CHSO₂CH₂CH₂OCH₂CH₂SO₂CH=CH₂

V-33

CH₂=CHSO₂CH₂CH₂CH₂OCH₂CH₂CH₂SO₂CH=CH₂

V-34

(CH₂=CH.SO₂CH₂CH₂CONH)₂CH₂

V-35

(CH₂=CH—SO₂CH₂CH₂CONH.CH₂)₂

V-36

(CH₂=CH—SO₂CH₂CH₂CONHCH₂)₂CH₂

V-37

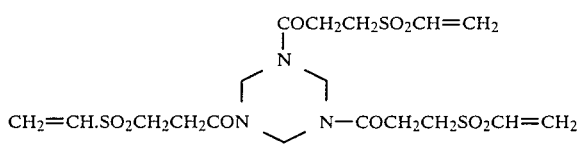

V-38

V-39

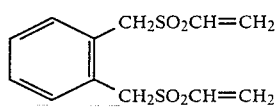

V-40

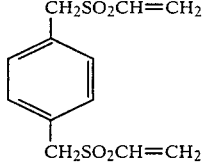

Addition of the polymeric hardeners is carried out by adding the hardeners dissolved in water or an organic solvent, directly to the layer which is desired to control the degree of hardening. When using diffusible hardeners, they may be added directly to the desired layer, but they may be added to other layers so as to diffuse into all the layers. The amount of anti-diffusible hardeners to be added is prescribed by the amount of reactive groups in the polymeric hardeners.

When using the hardeners, the anti-diffusible hardeners may be used alone or together with diffusible hardeners.

Thus, at least one insensitive upper layer can be selectively hardened in a manner that the melting time of the insensitive upper layer is longer than the melting time of the sensitive silver halide emulsion layer. Thereby, speed of oxidizing and dissolving the silver image by a reducer has different directions. That is, since at least one insensitive upper layer is strongly hardened than the sensitive silver halide emulsion layer in which the silver image is formed, the reducer attacks the silver image from the direction of diminishing silver image area (i.e., from the horizontal direction to the sensitive silver halide emulsion layer) more faster than from the direction of decreasing silver image density (i.e., from the perpendicular direction to the sensitive silver halide emulsion layer). Therefore, according to the present invention, the reduction width, i.e., the diminution in silver image area per the decrease in silver image density, can be widen.

The terminology "plate making sensitive materials of the present invention" means sensitive materials used when printing halftone images or line drawing images by photographic plate making in the field of printing industry. Although the species and properties of them are not especially limited, the most general sensitive materials are hard tone sensitive materials such as the so-called litho-film.

Accordingly, there are no restriction with respect to the types of silver halide used in the sensitive silver halide emulsion layer in the plate making sensitive materials of the present invention. Silver halides such as silver chlorobromide, silver chloroiodobromide, silver iodobromide and silver bromide can be used. However, it is particularly preferred to use silver chlorobromide or silver chloroiodobromide containing at least 60% by mol (preferably 75% by mol or more) of silver chloride and 0 to 5% by mol of silver iodide. Form, crystal habit and distribution of size of the silver halide particles are not especially limited, but it is preferred to have a particle size of 0.7μ or less.

The sensitivity of the silver halide emulsions can be increased without increasing the particle size by using gold compounds such as chloroaurate or gold trichloride, salts of noble metal such as rhodium or iridium, sulfur compounds forming silver sulfate by reacting with silver salts, or reductive substances such as stannous salts or amines.

Further, it is possible to add salts of noble metals such as rhodium or iridium, or iron compounds such as red prussiate, when physically ageing the silver halide particles or forming a nucleus.

As a hydrophilic colloid binder used in the light-insensitive upper layer(s) and the light-sensitive silver halide emulsion layer(s) of the present invention, it is advantageous to use gelatin, but other hydrophilic colloids can be used together with gelatin.

For example, it is possible to use proteins such as gelatin derivatives, graft polymers of gelatin and another high polymer, albumin or casein; saccharides such as cellulose derivatives such as hydroxyethyl cellulose, carboxymethyl cellulose or cellulose sulfates, sodium alginate or starch derivatives; and hydrophilic synthetic high molecular substances such as homo- or copolymers including polyvinyl alcohol, polyvinyl alcohol partial acetal, poly-N-vinylpyrrolidone, polyacrylic acid, polymethacrylic acid, polyacrylamide, polyvinylimidazole and polyvinyl pyrazole.

Examples of gelatins include not only lime treated gelatin but also acid treated gelatin and enzyme treated gelatin described in *Bull. Soc. Sci. Phot. Japan*, No. 16, page 30 (1966) may be used. Further, hydrolyzed products and enzymatic decomposition products of gelatin can be used.

It is possible to add polymer latexes composed of homo- or copolymer of alkyl acrylate, alkyl methacrylate, acrylic acid or cresidyl acrylate, described in U.S. Pat. Nos. 3,411,911, 3,411,912, 3,142,568, 3,325,286 and 3,547,650 and Japanese Patent Publication No. 5331/70, to the silver halide emulsion layer or other layers in order to improve dimensional stability of the photographic materials or improve film properties thereof.

In the photographic emulsions, it is possible to use any known anti-fogging agents as described in Japanese Patent Application (OPI) Nos. 81024/74, 6306/75 and 19429/75 and U.S. Pat. No. 3,850,639 such as numbers of heterocyclic compounds including 4-hydroxy-6-methyl-1,3,3a,7-tetraazaindene, 3-methylbenzothiazole or 1-phenyl-5-mercaptotetrazole, mercury containing compounds or mercapto compounds.

Photographic emulsions as used herein may be subjected to spectral sensitization using methine dyes, etc. Dyes which can be used include cyanine dyes, merocyanine dyes, composite cyanine dyes, composite merocyanine dyes, holopolar cyanine dyes, hemicyanine dyes, styryl dyes, and hemioxonol dyes, those described in U.S. Pat. Nos. 2,493,748, 2,503,776, 3,656,956, 3,672,897, 3,694,217, 4,025,349, 4,046,572, etc.

Surface active agents may be added to the silver halide emulsion layers of the present invention as coating assistants or for the purpose of improving photographic properties.

Examples of useful surface active agents include natural surface active agents such as saponin, nonionic surface active agents such as alkylene oxide active agents or glycidol active agents; anionic surface active agents containing acid groups such as carboxylic acid, sulfonic acid (for example, surface active agents described in U.S. Pat. No. 3,415,649), phosphoric acid, sulfuric acid ester or phosphoric acid ester groups; and ampholytic surface active agents such as aminoacids, aminosulfonic acids, or sulfuric acid or phosphoric acid esters of aminoalcohols.

Polyalkylene oxide compounds used in the present invention include alkylene oxide having 2 to 4 carbon atoms, for example, ethylene oxide, propylene-1,2-oxide and butylene-1,2-oxide; condensation products of polyalkylene oxide composed of at least 10 ethylene oxide units and a compound having at least one active hydrogen atom such as water, aliphatic alcohol, aromatic alcohol, aliphatic acid, organic amine or hexitol derivative; and block copolymers of two or more polyalkylene oxides. Namely, as the polyalkylene oxide compounds, it is possible to use polyalkylene glycols, polyalkylene glycol alkyl ethers, polyalkylene glycol aryl ethers, polyalkylene glycol alkylaryl esters, polyalkylene glycol esters, polyalkylene glycol aliphatic acid amides, polyalkylene glycol amines, polyalkylene glycol block copolymers and polyalkylene glycol graft polymers.

Examples of the polyalkylene oxide compounds preferably used in the present invention include the following compounds.

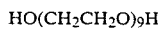

1. $HO(CH_2CH_2O)_9H$

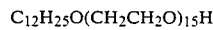

2. $C_{12}H_{25}O(CH_2CH_2O)_{15}H$

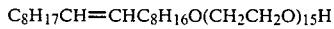

3. $C_8H_{17}CH=CHC_8H_{16}O(CH_2CH_2O)_{15}H$

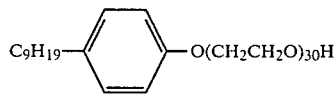

4. $C_9H_{19}\text{—}\langle\text{phenyl}\rangle\text{—}O(CH_2CH_2O)_{30}H$

5. $C_{11}H_{23}COO(CH_2CH_2O)_{80}H$

6. $C_{11}H_{23}CONH(CH_2CH_2O)_{15}H$

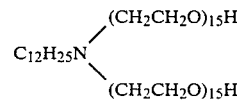

7. $C_{12}H_{25}N\begin{matrix}(CH_2CH_2O)_{15}H \\ (CH_2CH_2O)_{15}H\end{matrix}$

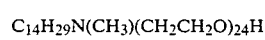

8. $C_{14}H_{29}N(CH_3)(CH_2CH_2O)_{24}H$

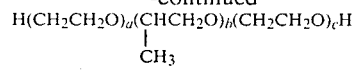

9. $H(CH_2CH_2O)_a(CHCH_2O)_b(CH_2CH_2O)_cH$
    $\qquad\qquad\qquad\quad |$
    $\qquad\qquad\qquad\ CH_3$ $a + b + c = 50$
$b:a + c = 10:9$ It is preferred that the ratio by weight of the hydrophilic colloid binder to silver halide in the silver halide emulsion layer of the present invention is ½ or less.

In the present invention, the silver halide emulsion layer is not always composed of one layer but it may be composed of two or more layers.

For example, when the silver halide emulsion layer is composed of two layers, it is preferred that the ratio of the total amount of silver halide in the two layers to the hydrophilic colloid polymer is ½ or less and that the upper sensitive emulsion layer contains a larger amount of hydrophilic colloid binder than the lower sensitive emulsion layer.

Further, the amount of silver halide to be coated is 1.0 to 6.0 g and, preferably, 1.5 to 4.0 g calculated as silver per square meter.

In order to obtain the reduction aptitude in the same degree as that of the present invention without the technique of the present invention, far larger amount of silver halide coated than the above amount (i.e., 1.0 to 6.0 g silver/m$^2$) is necessary. Thus, the present invention can provide superior reduction aptitude with a small amount of silver halide coated.

Further, the coating amount of the hydrophilic colloid binder in the insensitive upper layer of the present invention is not limited. However, the effect of the present invention becomes more remarkable when it is equal to or more than that in the sensitive silver halide emulsion layer.

For example, when the sensitive silver halide emulsion layer is composed of two layers and an insensitive colloid layer is present between an insensitive top layer and the sensitive silver halide emulsion layer, the total amount of hydrophilic colloid binder in the top layer and the colloid layer under it is preferably equal to or more than the coating amount of hydrophilic colloid binder in the two sensitive silver halide emulsion layers.

The sensitive upper layer in the present invention may contain surface active agents, antistatic agents, matting agents, lubricants, colloidal silica, plasticizers for gelation or polymer latexes, in addition to the above described hydrophilic colloid binder (for example, gelatin).

Examples of useful matting agents are particles of polymethyl methacrylate or silicon dioxide having a particle size of 0.1 to 10μ and preferably 1 to 5μ.

Examples of preferred bases of plate making sensitive materials of the present invention include polyester films such as polyethylene terephthalate films and cellulose ester films such as cellulose triacetate films.

In the present invention, the exposure for obtaining a photographic image may be carried out in a conventional manner. Any various known light sources including natural light (sunlight), a tungsten lamp, a fluorescent lamp, a mercury lamp, a xenon arc lamp, a carbon arc lamp, a xenon flash lamp, a cathode-ray tube flying spot and so on can be employed for the exposure. Suitable exposure times which can be used include not only exposure times commonly used in cameras ranging from about 1/1,000 to about 1 second, but also exposure times shorter than 1/1,000 second, for example, about 1/10$^4$ to about 1/10⁶ second as used with xenon flash lamps and cathode-ray tubes. Exposure times longer than 1 second can also be used. The spectral distribution of the light employed for the exposure can be controlled using color filters, if desired. Laser beams can also be employed for the exposure.

The present invention does not put any particular restriction on the development-processing of the photographic material for a photomechanical process. In general, any developing processes applied to conventional photographic material for a photomechanical process can be adopted in the development processing. Suitable processing temperatures used generally range from 18° C. to 50° C. However, processing temperatures lower than 18° C. or higher than 50° C. may be employed.

The developing solution can contain any known developing agents. Examples of developing agents which can be used alone or in mixtures include dihydroxybenzenes (e.g., hydroquinone), 3-pyrazolidones (e.g., 1-phenyl-3-pyrazolidone), aminophenols (e.g., N-methyl-p-aminophenol), 1-phenyl-3-pyrazolines, ascorbic acid, heterocyclic compounds of the kind which are obtained by condensating 1,2,3,4-tetrahydroquinoline rings and indolene rings as described in U.S. Pat. No. 4,067,872. In addition to such a developing agent as described above, the developing solution can contain a known preservative, an alkali agent, a pH buffer, an anti-foggant and so on. Further, it may optionally contain a dissolving aid, a color toning agent, a development accelerator, a surface active agent, an antifoaming agent, a water softener, a hardener, a viscosity imparting agent and so on.

The developing solution which can be employed to great advantage in the present invention is a so-called lith developer as described in T. H. James, *The Theory of the Photographic Process*, 4th Ed., pp. 419–421, Macmillan (1977). The lith developer is basically comprised of an ortho- or a para-dihydroxybenzene, an alkali agent, a small amount of free sulfite and a sulfite ion buffer and so on. The orhto- or the paradihydroxybenzene used as the developing agent can be properly selected from those well known in the photographic art. Specific examples of these compounds include hydroquinone, chlorohydroquinone, bromohydroquinone, isopropylhydroquinone, toluhydroquinone, methylhydroquinone, 2,3-dichlorohydroquinone, 2,5-dimethylhydroquinone and the like. Among these hydroquinones, hydroquinone is particularly suitable for practical use. These developing agents may be employed independently or in combination. A suitable amount of the developing agent to be added ranges from 1 to 100 g, more preferably 5 to 80 g, per liter of the developing solution.

A sulfite ion buffer is employed in the developing solution in an amount such that a sulfite ion concentration therein is effectively maintained approximately constant. Suitable examples of such buffers include adducts of aldehydes and alkali metal bisulfites such as formalin-sodium bisulfite adduct, adducts to ketones and alkali metal bisulfites such as acetone-sodium bisulfite adduct, a condensation products of carbonyl bisulfites and amines such as sodium bis(2-hydroxyethyl)aminomethane sulfonate, and so on. The sulfite ion buffer is generally added in an amount of 13 g to 130 g per liter of the developing solution.

In general, the concentration of free sulfite ions is controlled by the addition to the developing solution of an alkali metal sulfite such as sodium sulfite and the like. The amount of the sulfite added is generally 5 g or less, and particularly 3 g or less, per liter of the developing solution. Of course, the sulfite may be added in an amount of larger than 5 g.

In many cases, it is desirable to further add an alkali metal halide (especially a bromide such as sodium bromide, potassium bromide or the like) as a development-controlling agent. A suitable amount of the alkali metal halide to be added ranges preferably from 0.01 g to 10 g, most preferably 0.1 g to 5 g, per liter of the developing solution.

An alkali is added to adjust the developing solution to a pH of 9.0 or more (particularly to a pH of 9.7 to 11.5). Examples of alkalis generally used in the developing solution include sodium carbonate and potassium carbonate, and such a carbonate is in greatly differing amounts.

The fixation can be carried out using a fixing solution having a conventionally used composition.

Examples of fixing agents which can be used include thiosulfates, thiocyanates and, further, organic sulfur compounds which are known to have effects as fixing agents.

In the fixing solution, water-soluble aluminum salts may be incorporated as a hardener. In the case of dye image formation, conventional methods can be used in the fixing processing of the present invention.

Development-processing may be performed by hand labor, or by using an automatic developing machine. In the case of automatic development-processing, there are no restrictions as to the conveying means (e.g., a roller conveyer, a belt conveyer, etc.), and conveyance type automatic developing machines which have been used in the art can be employed. For further details of the compositions of processing solutions and the developing processes descriptions in U.S. Pat. Nos. 3,025,779, 3,078,024, 3,122,086, 3,149,551, 3,156,173, 3,224,356 and 3,573,914 and so on can be referred to.

Furthermore, for details of the silver halide emulsion layers, other layers and the support making up the photographic material for a photomechanical process of the present invention and for details of the processing process to be adopted in the present invention, descriptions in *Research Disclosure*, Vol. 176, pp. 22–28 (December, 1978) can be referred to.

There are no particular restrictions with respect to the reducing solution used in the present invention. For example, those described in C. E. K. Mees, *The Theory of the Photographic Process*, pp. 727–744, Macmillan (1954) can be effectively employed. Specifically, a reducing solution which contains as a reducing component a permanganate, a persulfate, a ferric salt, a cupric salt, a ceric salt, a hexacyanoferrate (III), a dichromate and the like independently or in combination and optionally, an inorganic acid such as sulfuric acid, and an alcohol; or a reducing solution which contains a reducing component such as a hexacyanoferrate (III), ethylenediaminetetraacetatoferrate (III) or the like, and a silver halide solvent such as a thiosulfate, a thiocyanate, thiourea or the derivatives thereof and, optionally, an inorganic acid such as sulfuric acid, can be employed. Representative examples of the reducing solution are Farmer's reducer comprising potassium ferricyanide and sodium thiosulfate (Kodak R-4), a reducing solution comprising a persulfate and potassium permanganate (Kodak R-5), a reducing solution comprising a persulfate (Kodak R-15) and a reducing solution comprising a ceric salt.

To the reducing solution to be employed in the present invention, a compound having a mercapto group, such as 2-amino-5-mercapto-thiadiazole, 1-phenyl-5-mercaptotetrazole, 2-amino-ethanthiol, monothioglycerol, etc., those described in Japanese Patent Application (OPI) Nos. 17123/80 and 68419/77 may be further added, if desired.

As for the composition of the reducing solution used in the reduction processing of the present invention and the processing conditions (temperature, time, etc.) therein, there are no particular limitations. These conditions can be properly selected by one skilled in the art.

The reduction processing of whole image can be carried out by immersing the photographic material for a photomechanical process in a reducing solution. In order to apply the reduction processing to a part of image, the reducing solution may be coated on the desired part of the image using a brush.

For details of the reducing solutions and the reduction processing which can be employed descriptions in the following patent specifications can be referred to: They include Japanese Patent Application (OPI) Nos. 140733/76, 6841/77, 14901/78, 119236/79, 119237/79, 2245/80, 2244/80, 17123/80, 79444/80 and 81344/80.

In the following, the present invention is illustrated in greater detail with reference to examples. However, the technical scope of the present invention is not limited to them, and various embodiments can be adopted.

EXAMPLE 1

A silver halide emulsion comprising 80% by mol of silver chloride, 19.5% by mol of silver bromide and 0.5% by mol of silver iodide was prepared by carrying out gold sensitization and sulfur sensitization by a conventional method. Gelatin contained in this emulsion was 45% by weight based on silver halide. After 3-carboxymethyl-5-[2-(3-ethyl-thiazolinylidene)ethylidene]-rhodanine (spectral sensitizer), 4-hydroxy-1,3,3a,7-tetraazaindene (stabilizer), polyoxyethylene nonylphenyl ether containing 50 ethylene oxide groups and a polymer latex described in Synthesis Example 3 in U.S. Pat. No. 3,525,620 were added to the emulsion, the emulsion was applied to a polyethylene terephthalate film base while adding mucochloric acid (hardener) in the following amount (see Table 1) to the emulsion layer, while Compound P-1 was added in the following amount (see Table 1) to the emulsion layer of the insensitive upper layer, to produce Samples 1 to 6 shown in the following Table 1. The amount of silver coated was 3.0 g/m$^2$ and the amount of gelatin coated in the insensitive upper layer was 1.0 g/m$^2$. The melting time of the emulsion layer and that of the insensitive upper layer of these samples measured by the above described method are shown in Table 1.

TABLE 1

| | Contents of Produced Samples | | | | | |
|---|---|---|---|---|---|---|
| | Amount of Mucochloric Acid (addition) to emulsion layer) (g/m$^2$) | Amount of Compound P-1 Added | | Melting Time (0.2 N NaOH, 75° C.) | | |
| Sample No. | | Addition to Emulsion Layer (g/m$^2$) | Addition to Insensitive Upper Layer (g/m$^2$) | Emulsion Layer (sec) | Insensitive Upper Layer (sec) | Remarks |
| 1 | 0.14 | None | None | 280 | 280 | Comparison |
| 2 | " | 0.29 | None | 400 | 350 | " |
| 3 | " | None | 0.29 | 300 | 450 | Invention |
| 4 | 0.01 | None | None | 80 | 80 | Comparison |
| 5 | " | 0.29 | None | 300 | 200 | " |
| 6 | " | None | 0.29 | 250 | 400 | Invention |

Halftone images were then formed on the above described samples by the following method.

An available negative gray contact screen (150 lines/inch) was placed in contact with each sample, and the sample was exposed to white tungsten light for 10 seconds through a step wedge having 0.1 of step difference. Each sample was developed at 20° C. for 3 minutes with the following lithographic developing solution, and it was then fixed, washed with water and dried by conventional methods.

Developing Solution

Sodium carbonate (monohydrate)—50 g
Formaldehyde-hydrogen sulfite addition compound—45 g
Potassium bromide—2 g
Hydroquinone—18 g
Sodium sulfite—2 g
Water to make—1 liter The resulting halftone strips were dipped in the following reducing solution at 20° C. for 20 to 100 seconds and washed with water.

Reducing Solution (Farmer's reducing solution)

First solution:
Water—200 cc
Sodium thiosulfate—20 g
Second solution:
Water—100 cc
Red prussiate—10 g 100 parts of the first solution, 5 parts of the second solution and 100 parts of water were blended before using.

A change of the area of dots and a change of the density of the dot in the resulting halftone strips were measured by a microdensitometer.

The area of dots when the density of each dot became 2.5 after treating the halftone strip having an area of dots of 50% with the reducing solution, the reduction time required for it, and the reduction width are shown in Table 2.

TABLE 2

| Sample No. | Before Reduction | | After Reduction | | | | Remarks |
|---|---|---|---|---|---|---|---|
| | Area of Dot (%) | Density of Dot | Area of Dot (%) | Density of Dot | Reduction Time (sec) | Reduction Width (%) | |
| 1 | 50 | more than 4.0 | 38 | 2.5 | 60 | 12 | Comparison |
| 2 | " | more than 4.0 | 39 | " | 100 | 11 | " |
| 3 | " | more than 4.0 | 33 | " | 75 | 17 | Invention |
| 4 | " | more than 4.0 | 36 | " | 45 | 14 | Comparison |
| 5 | " | more than 4.0 | 37 | " | 80 | 13 | " |
| 6 | " | more than 4.0 | 30 | " | 70 | 20 | Invention |

Table 2 clearly shows that the reduction width is wide in Samples 3 and 6 which were produced according to the present invention. The results show that it is possible to reduce the area of dots without causing remarkable reduction of the density of dots, by the reduction treatment of the present invention.

The effect is particularly remarkable in Sample 6.

On the other hand, the density of dots is remarkably reduced in Comparison Sample 1 and the reduction speed of the area of dots is too slow in Comparison Sample 2. Inversely, the reduction speed of the area of dots is too high in Sample 4 and, consequently, it is difficult to control the area of dots by the reduction treatment. Further, in Sample 4 halftone quality is inferior and scratch strength of the emulsion film is low, because the emulsion film is too soft.

EXAMPLE 2

Halftone images (area of dots: 50%) were formed on Samples 1 to 6 in Example 1 (by the following method). A mesh original having an area of dots of 55% was placed in contact with each sample, and the sample was exposed to white tungsten light for 10 seconds through a step wedge having a step difference of 0.1. Each sample was subjected to high temperature rapid development at 38° C. for 20 seconds using the following developing solution, and then it was fixed, washed with water and dried by conventional methods.

Developing Solution

Sodium carbonate (monohydrate)—11 g
Potassium bromide—3 g
Hydroquinone—23 g
1-Phenyl-3-pyrazolidone—0.4 g
Sodium sulfite—67 g
Potassium hydroxide—11 g
Water to make—1 liter The resulting halftone strips were dipped in the following cerium reducing solution (20° C.), followed by washing with water.

Reducing Solution

Ceric sulfate—25 g
Concentrated sulfuric acid—30 g
Water to make—1 liter

A change of the area of dots and a change of the density of dots in the resulting halftone strips were measured by a microdensitometer. The area of dots when the density of each dot became 2.5 after treating the halftone strip having an area of dots of 50% with the reducing solution, the reduction time required for it, and the reduction width are shown in Table 3.

TABLE 3

| Sample No. | Before Reduction | | After Reduction | | | | Remarks |
|---|---|---|---|---|---|---|---|
| | Area of Dot (%) | Density of Dot | Area of Dot (%) | Density of Dot | Reduction Time (sec) | Reduction Width (%) | |
| 1 | 50 | more than 4.0 | 41 | 2.5 | 55 | 9 | Comparison |
| 2 | " | " | 41 | " | 90 | 9 | " |
| 3 | " | " | 37 | " | 70 | 13 | Invention |
| 4 | " | " | 38 | " | 45 | 12 | Comparison |
| 5 | " | " | 39 | " | 75 | 11 | " |
| 6 | " | " | 34 | " | 60 | 16 | Invention |

Table 3 clearly shows that Samples 3 and 6 of the present invention have a broad reduction width and moderate reduction speed.

EXAMPLE 3

A silver halide emulsion comprising 80% by mol of silver chloride, 19.5% by mol of silver bromide and 0.5% by mol of silver iodide was prepared by gold sensitization and sulfur sensitization by a conventional method. Gelatin contained in this emulsion was 45% by weight based on silver. After 3-carboxy-5-[2-(3-ethyl-thiazolinylidene)ethylidene]rhodanine (spectral sensitizer), 4-hydroxy-1,3,3a,7-tetraazaindene (stabilizer), polyoxyethylene nonylphenyl ether containing 50 ethylene oxide groups and a polymer latex described in Synthesis Example 3 in U.S. Pat. No. 3,525,620 were added to the emulsion, the emulsion was applied to a polyethylene terephthalate film base while adding mucochloric acid (hardener) in the following amount (see Table 4) to the emulsion layer, while Compound P-1 was added in the following amount (see Table 4) to the insensitive upper layer, to produce Samples 1 to 6 shown in the following Table 4. The amount of silver coated was 3.0 g/m$^2$, and the amount of gelatin coated in the insensitive upper layer was 1.0 g/m$^2$. The melting time of the emulsion layer and that of the insensitive upper layer of these samples measured by the above described method are shown in Table 4.

A change of the area of dots and a change of the density of dots in the resulting halftone strips were measured by a microdensitometer. The area of dots when the density of each dot became 2.5 after treating the halftone strip having an area of dots of 50% with the reducing solution, the reduction time required for it, and the reduction width are shown in Table 5.

TABLE 5

| Sample No. | Before Reduction | | After Reduction | | | | |
|---|---|---|---|---|---|---|---|
| | Area of Dot (%) | Density of Dot | Area of Dot (%) | Density of Dot | Reduction Time (sec) | Reduction Width (%) | Remarks |
| 1 | 50 | more than 4.0 | 42 | 2.5 | 45 | 8 | Comparison |
| 2 | " | " | 40 | " | 50 | 10 | Invention |
| 3 | " | " | 39 | " | 65 | 11 | " |
| 4 | " | " | 35 | " | 75 | 15 | " |
| 5 | " | " | 33 | " | 85 | 17 | " |
| 6 | " | " | 32 | " | 100 | 18 | " |

Table 5 clearly shows that the melting time of the insensitive upper layer becomes longer and the reduction width becomes broader as the amount of Compound P-1 added to the insensitive upper layer is increased. Further, it can be seen that the time required for reduction also increases.

TABLE 4

| | Contents of Produced Samples | | | | |
|---|---|---|---|---|---|
| Sample No. | Amount of Mucochloric Acid (addition to emulsion layer) (g/m$^2$) | Amount of Compound P-1 (addition to insensitive upper layer) (g/m$^2$) | Melting Time (0.2 N NaOH, 75° C.) | | Remarks |
| | | | Emulsion Layer (sec) | Insensitive Upper Layer (sec) | |
| 1 | 0.07 | None | 270 | 270 | Comparison |
| 2 | " | 0.07 | 275 | 310 | Invention |
| 3 | " | 0.15 | 280 | 340 | " |
| 4 | " | 0.29 | 285 | 420 | " |
| 5 | " | 0.44 | 290 | 480 | " |
| 6 | " | 0.58 | 290 | 530 | " |

Halftone images (area of dots: 50%) were formed on the above described samples by the following method. A mesh original having an area of dots of 55% was placed in contact with each sample, and the sample was exposed to white tungsten light for 10 seconds through a step wedge having a step difference of 0.1. Each sample was subjected to development at 20° C. for 3 minutes using the following developing solution, and then it was fixed, washed with water and dried by conventional methods.

Developing Solution

Sodium carbonate—50 g
Formaldehyde-hydrogen sulfite addition compound—45 g
Potassium bromide—2 g
Hydroquinone—18 g
Sodium sulfite—2 g
Water to make—1 liter The resulting halftone strips were dipped in the following reducing solution (20° C.) and then washed with water.

Reducing Solution

Ceric sulfate—25 g
Concentrated sulfuric acid—30 g
Water to make—1 liter

EXAMPLE 4

A silver halide emulsion comprising 80% by mol of silver chloride, 19.5% by mol of silver bromide and 0.5% by mol of silver iodide was prepared by carrying out gold sensitization and sulfur sensitization by a conventional method. Gelatin contained in this emulsion was 45% by weight based on silver halide. After 3-carboxymethyl-5-[2-(3-ethyl-thiazolinylidene)ethylidene]-rhodanine (spectral sensitizer), 4-hydroxy-1,3,3a,7-tetraazaindene (stabilizer), polyoxyethylene nonylphenyl ether containing 50 ethylene oxide groups and a polymer latex described in Synthesis Example 3 in U.S. Pat. No. 3,525,620 were added to the emulsion, the emulsion was applied to a polyethylene terephthalate film base while adding mucochloric acid (hardener) in the following amount (see Table 6) to the emulsion layer, while Compound P-4 was added in the following amount (see Table 6) to the insensitive upper layer, to produce Samples 1 to 6 shown in the following Table 6. The amount of silver coated was 3.0 g/m$^2$ and the amount of gelatin coated in the insensitive upper layer was 1.0 g/m$^2$. The melting time of the emulsion layer and that of the insensitive upper layer of these samples measured by the above described method are shown in Table 6.

TABLE 6

| Sample No. | Amount of Mucochloric Acid (addition to emulsion layer) (g/m²) | Amount of Compound P-1 (addition to insensitive upper layer) (g/m²) | Melting Time (0.2 N NaOH, 75° C.) Emulsion Layer (sec) | Melting Time (0.2 N NaOH, 75° C.) Insensitive Upper Layer (sec) | Remarks |
|---|---|---|---|---|---|
| 1 | 0.07 | None | 270 | 270 | Comparison |
| 2 | " | 0.07 | 275 | 300 | Invention |
| 3 | " | 0.15 | 280 | 340 | " |
| 4 | " | 0.29 | 280 | 430 | " |
| 5 | " | 0.44 | 285 | 470 | " |
| 6 | " | 0.58 | 290 | 540 | " |

Halftone images (area of dots: 50%) were formed on the above described samples by the following method. A mesh original having an area of dots of 55% was placed in contact with each sample, and the sample was exposed to white tungsten light for 10 seconds through a step wedge having a step difference of 0.1. Each sample was subjected to development at 20° C. for 3 minutes using the following developing solution, and then it was fixed, washed with water and dried by conventional methods.

Developing Solution

Sodium carbonate—50 g
Formaldehyde-hydrogen sulfite addition compound—45 g
Potassium bromide—2 g
Hydroquinone—18 g
Sodium sulfite—2 g
Water to make—1 liter The resulting halftone strips were dipped in the following reducing solution (20° C.) and then washed with water.

Reducing Solution

Ceric sulfate—25 g
Concentrated sulfuric acid—30 g
Water to make—1 liter

A change of the area of dots and a change of the density of dots in the resulting halftone strips were measured by a microdensitometer. The area of dots when the density of each dot became 2.5 after treating the halftone having an area of dots of 50% with the reducing solution, the reduction time required for it, and the reduction width are shown in Table 7.

TABLE 7

| Sample No. | Before Reduction Area of Dot (%) | Before Reduction Density of Dot | After Reduction Area of Dot (%) | After Reduction Density of Dot | Reduction Time (sec) | Reduction Width (%) | Remarks |
|---|---|---|---|---|---|---|---|
| 1 | 50 | more than 4.0 | 43 | 2.5 | 50 | 7 | Comparison |
| 2 | " | " | 41 | " | 60 | 9 | Invention |
| 3 | " | " | 38 | " | 65 | 12 | " |
| 4 | " | " | 36 | " | 75 | 14 | " |
| 5 | " | " | 34 | " | 90 | 16 | " |
| 6 | " | " | 33 | " | 95 | 17 | " |

Table 7 clearly shows that the melting time of the insensitive upper layer becomes longer and the reduction width becomes broader as the amount of Compound P-4 added to the insensitive upper layer is increased. Further, it is understood that the time required for reduction also increases.

EXAMPLE 5

A polyethylene terephthalate film base having a subbing layer was coated with the following layers, in the order of description, by a multilayer simultaneous coating method to prepare Samples 1 to 8.

Layer-1

Light-sensitive silver halide emulsion layer

A silver halide emulsion comprising 80% by mol of silver chloride, 19.5% by mol of silver bromide and 0.5% by mol of silver iodide was prepared by carrying out gold sensitization and sulfur sensitization by a conventional method. Gelatin contained in this emulsion was 45% by weight based on silver halide. After 3-carboxymethyl-5-[2-(3-ethyl-thiazolinylidene)ethylidene]-rhodanine (spectral sensitizer), 4-hydroxy-1,3,3a,7-tetraazaindene (stabilizer), polyoxyethylene nonylphenyl ether containing 50 ethylene oxide groups and a polymer latex described in Synthesis Example 3 in U.S. Pat. No. 3,525,620 were added to the emulsion, each low molecular hardener shown in the following Table 8 was added to the emulsion. Each emulsion was coated in a silver coated amount of 3.0 g/m².

Layer-2

First light-insensitive upper layer

A mixture composition of gelatin (5 g/100 cc $H_2O$), a polymer latex (40 wt% based on gelatin), sodium dodecylbenzenesulfonate (0.4 wt% based on gelatin) and a matting agent (polymethyl methacrylate, average parti particle size of 30 to 40μ) was coated in a dry thickness of 1μ.

Layer-3

Second light-insensitive upper layer (top layer)

A mixture composition of gelatin (1 g/100 cc $H_2O$), sodium dodecylbenzenesulfonate (10 mg per gelatin) and each hardener shown in Table 8 was coated in a dry thickness of 1μ.

TABLE 8

| Sample No. | Hardener Added to the Emulsion Layer | Hardener Added to 2nd Insensitive Layer |
|---|---|---|
| 1 | Glyoxal (1.7 wt % based on dry gelatin of total layers) | None |
| 2 | Glyoxal (1.7 wt % based on | Polymeric Hardener P-2 (80 mg/m²) |

TABLE 8-continued

| Sample No. | Hardener Added to the Emulsion Layer | Hardener Added to 2nd Insensitive Layer |
|---|---|---|
| 3 | Active Vinyl Hardener V-1 (1.9 wt % based on dry gelatin of total layers) | None |
| 4 | Active Vinyl Hardener V-1 (1.9 wt % based on dry gelatin of total layers) | Polymeric Hardener P-2 (80 mg/m²) |
| 5 | Active Vinyl Hardener V-7 (2.6 wt % based on dry gelatin of total layers) | None |
| 6 | Active Vinyl Hardener V-7 (2.6 wt % based on dry gelatin of total layers) | Polymeric Hardener P-2 (80 mg/m²) |
| 7 | Active Vinyl Hardener V-7 (1.3 wt % based on dry gelatin of total layers) | Polymeric Hardener P-2 (80 mg/m²) and Active Vinyl Hardener V-7 (1.3 wt % based on dry gelatin of total layers) |
| 8 | Active Vinyl Hardener V-7 (2.6 wt % based on dry gelatin of total layers) | Polymeric Hardener P-17 (80 mg/m²) |

Each sample was stored at 25° C. and 60% RH or 75% RH. Swelling degree represented by the following formula was measured in 25° C. water with passage of time, and days (after coating) required to reach a constant swelling degree was measured. The results obtained are shown in Table 9.

$$\text{Swelling Degree} = \frac{\text{Film thickness increased by swelling}}{\text{Film thickness at dry state}}$$

Furthermore, photographic properties of each sample were measured in the same manner as described in Example 1 of U.S. Pat. No. 3,525,620 and, thereby, relative sensitivity and days required to reach a stable sensitivity were measured. The results obtained are also shown in Table 9.

Moreover, the melting time of the light-sensitive silver halide emulsion layer and that of the second light-insensitive upper layer (top layer) of these samples were measured by the aforementioned method. The results are also shown in Table 9.

TABLE 9

| Sample No. | Stored at 25° C., 60% RH | | Stored at 25° C., 75% RH | |
|---|---|---|---|---|
| | Days Required to Reach a Constant Swelling (day) | Days Required to Reach a Constant Sensitivity (day) | Days Required to Reach a Constant Swelling (day) | Days Required to Reach a Constant Sensitivity (day) |
| 1 | 5 | 5 | 2 | 2 |
| 2 | 20 | 22 | 10 | 10 |
| 3 | 8 | 8 | 4 | 4 |
| 4 | 7 | 7 | 3 | 3 |
| 5 | 6 | 6 | 3 | 3 |
| 6 | 5 | 5 | 2 | 2 |
| 7 | 5 | 5 | 2 | 2 |
| 8 | 5 | 5 | 2 | 2 |

| Sample No. | Stored at 25° C., 60% RH | | Stored at 25° C., 75% RH | | Melting Time (0.2 N NaOH, 75° C.) | |
|---|---|---|---|---|---|---|
| | Relative Sensitivity | Final Swelling Degree | Relative Sensitivity | Final Swelling Degree | Layer (top layer) (sec) | Emulsion Layer (sec) |
| 1 | 108 | 1.21 | 100 | 1.18 | 310 | 310 |
| 2 | 130 | 1.63 | 100 | 1.10 | 405 | 290 |
| 3 | 107 | 1.21 | 100 | 1.20 | 760 | 760 |
| 4 | 105 | 1.19 | 100 | 1.15 | 1,130 | 790 |
| 5 | 108 | 1.21 | 100 | 1.17 | 770 | 770 |
| 6 | 104 | 1.12 | 100 | 1.10 | 1,180 | 800 |
| 7 | 105 | 1.15 | 100 | 1.13 | 1,150 | 790 |
| 8 | 104 | 1.12 | 100 | 1.10 | 1,140 | 800 |

Table 9 clearly shows that when Samples 4 and 6 using a combination of an active vinyl compound as a low molecular hardener and a polymeric hardener are compared with Sample 2 using a combination of glyoxal as a low molecular hardener and a polymeric hardener, the hardening rate of Samples 4 and 6 is faster than that of Sample 2. Further, the hardening rate of Sample 2 can be hastened by changing the humidity at storage from 60% RH to 75% RH. But, the hastened hardening rate of Sample 2 (i.e., storage at 75% RH) is yet slower than the hardening rate of Samples 4 and 6. Moreover, Sample 2 has a fatal defect that the difference in the hardening rate between the storage at 65% RH and the storage at 75% RH is very large, that is, the hardening rate of Sample 2 greatly depends on the humidity at storage. On the other hand, the hardening rate of Samples 4 and 6 is less dependent on the humidity at storage.

Further, even when the active vinyl low molecular hardener is added to the emulsion layer and the 2nd insensitive upper layer (i.e., Sample 7), the hardening rate thereof is fast and the hardening rate is less dependent on the humidity at storage.

Since the hardening rate of Sample 2 using a combination of glyoxal and a polymeric hardener greatly depends on the humidity at storage, photographic property of Sample 2 also greatly depends on the humidity at storage. On the other hand, when a combination of an active vinyl low molecular hardener and a polymeric hardener is used, photographic property thereof is much less dependent on the humidity at storage.

Halftone images were then formed on the above described samples by the following method.

An available negative gray contact screen (150 lines-/inch) was placed in contact with each sample, and the sample was exposed to white tungsten light for 10 seconds through a step wedge having 0.1 of step difference. Each sample was subjected to high temperature rapid development at 38° C. for 20 seconds using the following developing solution, and it was fixed, washed with water and dried by conventional methods.

Developing Solution

Sodium carbonate (monohydrate)—11 g
Potassium bromide—3 g
Hydroquinone—23 g
1-Phenyl-3-pyrazolidone—0.4 g
Sodium sulfite—67 g
Potassium hydroxide—11 g
Water to make—1 liter The resulting halftone strips were dipped in the following cerium reducing solution (I) (20° C.) or ferric ethylenediaminetetraacetate reducing solution (II) (20° C.), followed by washing with water.

Reducing Solution (I)

Ceric sulfate—25 g
Concentrated sulfuric acid—30 g
Water to make—1 liter

Reducing Solution (II)

Sodium ferric ethylenediaminetetraacetate—85 g
Thiourea—65 g
Citric acid—60 g
Hydrochloric acid—(amount necessary to adjust pH to 0.03)
Water to make—1 liter A change of the area of dots and a change of the density of dots in the resulting halftone strips were measured by a microdensitometer. The area of dots when the density of each dot became 2.5 after treating the halftone strip having an area of dots of 50% with the reducing solution was measured. The reduction width was calculated from the difference between the area of dots before reduction processing (i.e., 50%) and the area of dots after reduction processing. Also, the reduction time required for reaching the density of each dot to 2.5 was measured. Results of the reduction width and the reduction time are shown in Table 10.

TABLE 10

| | Reducing Solution (I) | | Reducing Solution (II) | |
|---|---|---|---|---|
| Sample No. | Reduction Width (%) | Reduction Time (sec) | Reduction Width (%) | Reduction Time (sec) |
| 1 | 6 | 30 | 4 | 23 |
| 2 | 13 | 58 | 8 | 36 |
| 3 | 7 | 40 | 5 | 42 |
| 4 | 14 | 60 | 15 | 65 |
| 5 | 8 | 47 | 6 | 43 |
| 6 | 14 | 61 | 15 | 64 |
| 7 | 14 | 55 | 15 | 58 |
| 8 | 14 | 54 | 15 | 57 |

Table 10 clearly shows that the reduction width is wide in Samples 2, 4, 6, 7 and 8 being hardened by a combination of a low molecular hardener and a polymeric hardener. Especially, in Samples 4, 6, 7 and 8 being hardened by a combination of an active vinyl low molecular hardener and a polymeric hardener, the reduction width is much less dependent on the kind of the reducing solution used. Furthermore, Samples 4, 6, 7 and 8 have moderate reduction time.

While the invention has been described in detail and with reference to specific embodiments thereof, it will be apparent to one skilled in the art that various changes and modifications can be made therein without departing from the spirit and scope thereof.

What is claimed is:

1. A method of reduction treatment for a silver halide light-sensitive material for plate making, comprising the steps of:
   providing a silver halide photographic light-sensitive material for plate making comprising a support base having thereon a sensitive silver halide emulsion layer and at least one insensitive upper layer having a melting time longer than the melting time of the sensitive silver halide emulsion layer, said at least one insensitive upper layer having been hardened by a polymeric hardener;
   exposing the silver halide photographic light-sensitive material;
   developing the exposed material in order to form silver images; and
   carrying out reduction treatment of the developed silver images.

2. The method claimed in claim 1, wherein said sensitive layer is hardened by a diffusible low molecular weight hardener.

3. The method claimed in claim 1, wherein said insensitive upper layer is hardened by a polymeric hardener and said sensitive and said insensitive upper layer are hardened by a diffusible low weight molecular hardener.

4. The method claimed in claim 3, wherein said diffusible low weight molecular weight hardener is an active vinyl hardener.

5. The method claimed in claim 1, wherein said silver halide is selected from the group consisting of silver chlorobromide and silver chloroiodobromide containing 60% by mol or more of silver chloride.

6. The method claimed in claim 5, wherein said silver halide is selected from the group consisting of silver chlorobromide and silver chloroiodobromide containing 75% by mol or more of silver chloride.

7. The method claimed in claim 5, wherein said silver halide contains 0 to 5% by mol of silver iodide.

8. The method claimed in claim 6, wherein said silver halide contains 0 to 5% by mol of silver iodide.

9. The method claimed in claim 7, wherein said silver halide particles have a size of $0.7\mu$ or less.

10. The method claimed in claim 9, wherein said silver halide is present in an amount of from 1.0 to 6.0 g silver/m$^2$.

11. The method claimed in claim 10, wherein said silver halide is present in an amount of from 1.5 to 4.0 g silver/m$^2$.

12. The method claimed in claim 8, wherein said silver halide particles have a size of $0.7\mu$ or less.

13. The method claimed in claim 12, wherein said silver halide is present in an amount of from 1.0 to 6.0 g silver/m$^2$.

14. The method claimed in claim 13, wherein said silver halide is present in an amount of from 1.5 to 4.0 g silver/m$^2$.

15. The method claimed in claim 1, wherein said polymeric hardener is represented by the following formula (I):

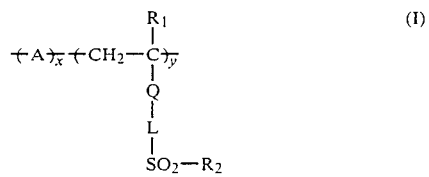

wherein A is a monomer unit prepared by copolymerizing copolymerizable ethylenically unsaturated monomer; $R_1$ is hydrogen or a lower alkyl group having 1 to 6 carbon atoms; Q is —CO$_2$—,

(wherein $R_1$ is the same as defined above) or an arylene group having 6 to 10 carbon atoms; L is a divalent group having 3 to 15 carbon atoms and containing at least one linking group selected from the group consisting of —$CO_2$— and

(wherein $R_1$ is the same as defined above) or a divalent group having 1 to 12 carbon atoms and containing at least one linking group selected from the group consisting of

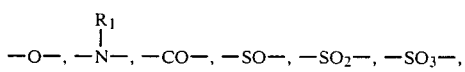

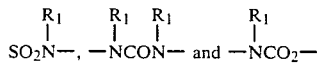

(wherein $R_1$ is the same as defined above); $R_2$ is —CH=$CH_2$ or —$CH_2CH_2X$ (wherein X is a group capable of being displaced by a nucleophilic group or a group capable of being released in the form of HX by reaction with a base; and x and y each represents molar percent, x being from 0 to 99 and y being from 1 to 100.

16. The method claimed in claim 1, wherein said polymeric hardener is represented by the following general formula (II):

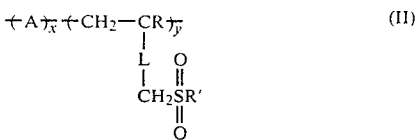 (II)

wherein A is a polymerized α,β-ethylenically unsaturated addition polymerizable monomer or a mixture of such polymerizable monomers; x and y each represents molar percent, x being from 10 to about 95 and y being from 5 to 90; R is hydrogen or an alkyl group having 1 to 6 carbon atoms; R' is —$CHCHR_2$ or —$CH_2CH_2X$ (wherein X is a group capable of being substituted with a nucleophilic group or a group capable of being released in the form of HX by reaction with a base; $R_2$ is alkyl, aryl or hydrogen; —L— is a linking group selected from the group consisting of alkylene, arylene having about 6 to 12 carbon atoms, —COZ— and —$COZR_3$—; $R_3$ is alkylene or arylene; and Z is —O— or —NH—.

17. The method claimed in claim 1, wherein said polymeric hardener is represented by the following general formula (III):

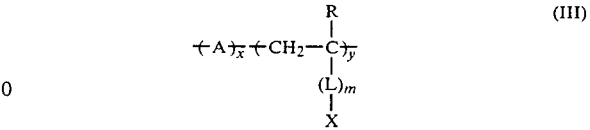 (III)

wherein A is a monomer unit copolymerized with a copolymerizable ethylenically unsaturated monomer; R is a hydrogen atom or an alkyl group having 1 to 6 carbon atoms; L is a divalent linking group having 1 to 20 carbon atoms; X is an active ester group; x and y each represents molar percent, x being from 0 to 95 and y being from 5 to 100; and m is 0 or 1.

* * * * *